United States Patent [19]
Upton

[11] Patent Number: 5,245,557
[45] Date of Patent: Sep. 14, 1993

[54] HIGH EFFICIENCY DIGITAL INTEGRATE AND DUMP

[75] Inventor: Eric L. Upton, Redondo Beach, Calif.

[73] Assignee: TRW Inc., Redondo Beach, Calif.

[21] Appl. No.: 743,962

[22] Filed: Aug. 12, 1991

[51] Int. Cl.$^5$ ............................................. G06J 3/00
[52] U.S. Cl. ................................................... 364/605
[58] Field of Search .................... 364/605, 724.01, 825, 364/839; 341/131, 156; 328/127

[56] References Cited

U.S. PATENT DOCUMENTS

| | | | |
|---|---|---|---|
| 3,740,537 | 6/1973 | Giles et al. | 364/724.01 |
| 4,023,019 | 5/1977 | Leibowitz et al. | |
| 4,320,390 | 3/1982 | Scott | 341/156 |
| 4,730,267 | 3/1988 | Hughes | 364/839 |

Primary Examiner—Tan V. Mai
Attorney, Agent, or Firm—G. Gregory Schivley; Ronald I. Taylor

[57] ABSTRACT

A high efficiency digital integrate and dump circuit with a digital output is provided for recovering digital information from an analog input signal. The circuit utilizes a method of preprocessing the input signal in such a manner as to eliminate the need for a separate dump cycle. An integration cycle is provided which includes an integrator for performing integration, the output of which provides a constant preprocessing input that is added to the analog input signal for preprocessing purposes. The integrated output is converted from analog to digital with an analog-to-digital converter. The digitized integrated output then undergoes a postprocessing cycle whereby the previously added bi-level preprocessing input's integral is subtracted from the digitized integrated output. The difference between clocked digital integrated output is measured and provided as the integrated response.

12 Claims, 3 Drawing Sheets

HIGH EFFICIENCY DIGITAL INTEGRATE AND DUMP

BACKGROUND OF THE INVENTION

1. Technical Field

This invention relates to data extraction filtering devices, and, more particularly, to a digital integrate and dump circuit with a digital output for recovering digital information from an analog input signal.

2. Discussion

There is a desirability for a more efficient recovery of information from an analog signal which is often corrupted with noise. Generally, an ideal form of a matched filter known as an integrate and dump filter provides optimum recovery of information with maximum processing gain and low bit error rate over each baud interval. Typical integrate and dump filters include filtering devices for integrating a voltage input over a specified time interval, and thereafter, providing the result of the integration as the filter output. Such a device is generally employed for determining the cumulative polarity of the input signal over the integration time interval.

Generally, prior art integrate and dump filters do not achieve the highest efficiency with maximum processing gain and lowest bit error rate possible. This is especially true for high data rates. A typical circuit provides alternating integrate and dump circuits which require separate integrate and dump functions. The separate integrate and dump circuits essentially alternate in function from bit interval to bit interval. This results in an inefficiency created by the separate dump interval which is not allowed to happen instantaneously as desired. This is due to the separate dump interval requiring a large portion of the baud interval thereby leaving a shorter interval for the integration function. As a result, less energy is allowed to be accounted for during the integration process. In addition, the separate dump interval usually requires excess circuitry, resulting in a more expensive and bulky circuit configuration.

Additionally, the dumping process is not always accurate due to the fact that some charge is left on the integrator's capacitor. This charge is an error that is dependent on the value of the previous baud and, therefore, is undesirable.

It is therefore desirable to obtain a more efficient integrate and dump circuit that does not suffer from the inefficiency of a separate dump interval. Furthermore, it is desirable to have a high efficiency integrate and dump circuit that provides maximum processing gain and lowest bit error rate possible.

SUMMARY OF THE INVENTION

In accordance with the teachings of the present invention, a high efficiency digital integrate and dump circuit with a digital output is employed to recover digital information from an analog signal often corrupted with noise. The circuit performs an integrate and dump function. However, it does not require a separate dump cycle.

The invention maintains a constant integrate cycle by injecting a constant on the input of the integrator that maintains the output at or about midrange. Essentially, the addition of the constant provides preprocessing of the integrator input, the constant being determined by the output of the last clocked integrator output. The integrated output is converted from analog to digital. The digital output then undergoes a postprocessing step whereby the previously injected constant is then subtracted from the digitized output. Furthermore, the circuit provides the difference between the current output signal and the previous output signal to obtain the recovered data.

BRIEF DESCRIPTION OF THE DRAWINGS

The various advantages of the present invention will become apparent to those skilled in the art by reading the following specification and by reference to the drawings in which.

DETAILED DESCRIPTION OF THE PREFERRED EMBODIMENT

Figure 1:
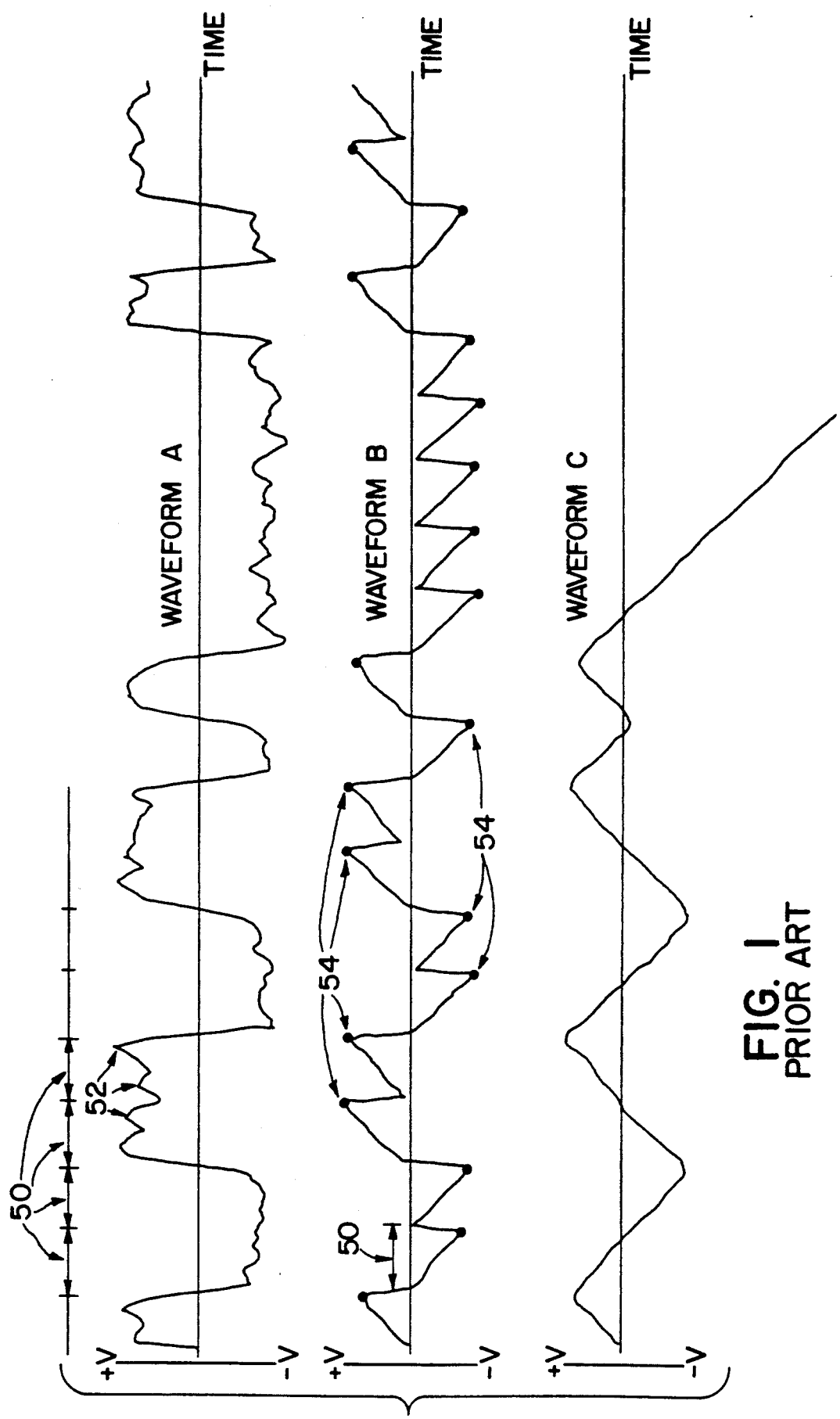
FIG. 1 is a timing diagram which illustrates the performance of a typical prior art integrate and dump.

Turning now to FIG. 1, the timing diagram shown therein illustrates the response of a typical integrate and dump converter. Waveform A is an example of an analog signal containing a bit stream of information over several bit intervals 50. Generally, such a signal is often corrupted with noise as shown by the ripples 52. An integrate and dump circuit receives an analog signal such as this and recovers the desired information. The circuit preferably has the highest possible efficiency with a maximum processing gain thereby achieving the lowest bit error rate.

Waveform B illustrates the output response of a typical integrate and dump circuit adapted to receive the input analog signal shown in waveform A. The analog input signal is integrated over each bit interval 50. At the end of each bit interval a decision is made and a separate dump cycle is essentially required to dump the response back to zero and continue the integration thereafter. The output may essentially be a digital or analog response containing the peak values 54 shown at the end of each bit interval 50.

Integrate and dump responses of the kind found on waveform B require a separate dump cycle. This separate dump cycle, however, results in a more inefficient integration process. This is because the dump cycle requires a substantial portion of each bit interval especially at higher baud rates. Since these kinds of filters typically include capacitors for performing the integration, a considerable amount of time is necessary to substantially discharge the capacitors.

The present invention provides for a more efficient integrate and dump circuit by eliminating the need for a separate dump cycle. As an illustration, waveform C is provided to show the response of a prior art integrate and dump circuit with the necessary dump cycle having been removed. The elimination of the dump cycle itself does not provide an adequate response for a prior art integrate and dump circuit. As waveform C illustrates, a continuous stream of like information results in an integration output that exceeds the limits of the integrator and results in saturation of the circuit.

Figure 2:
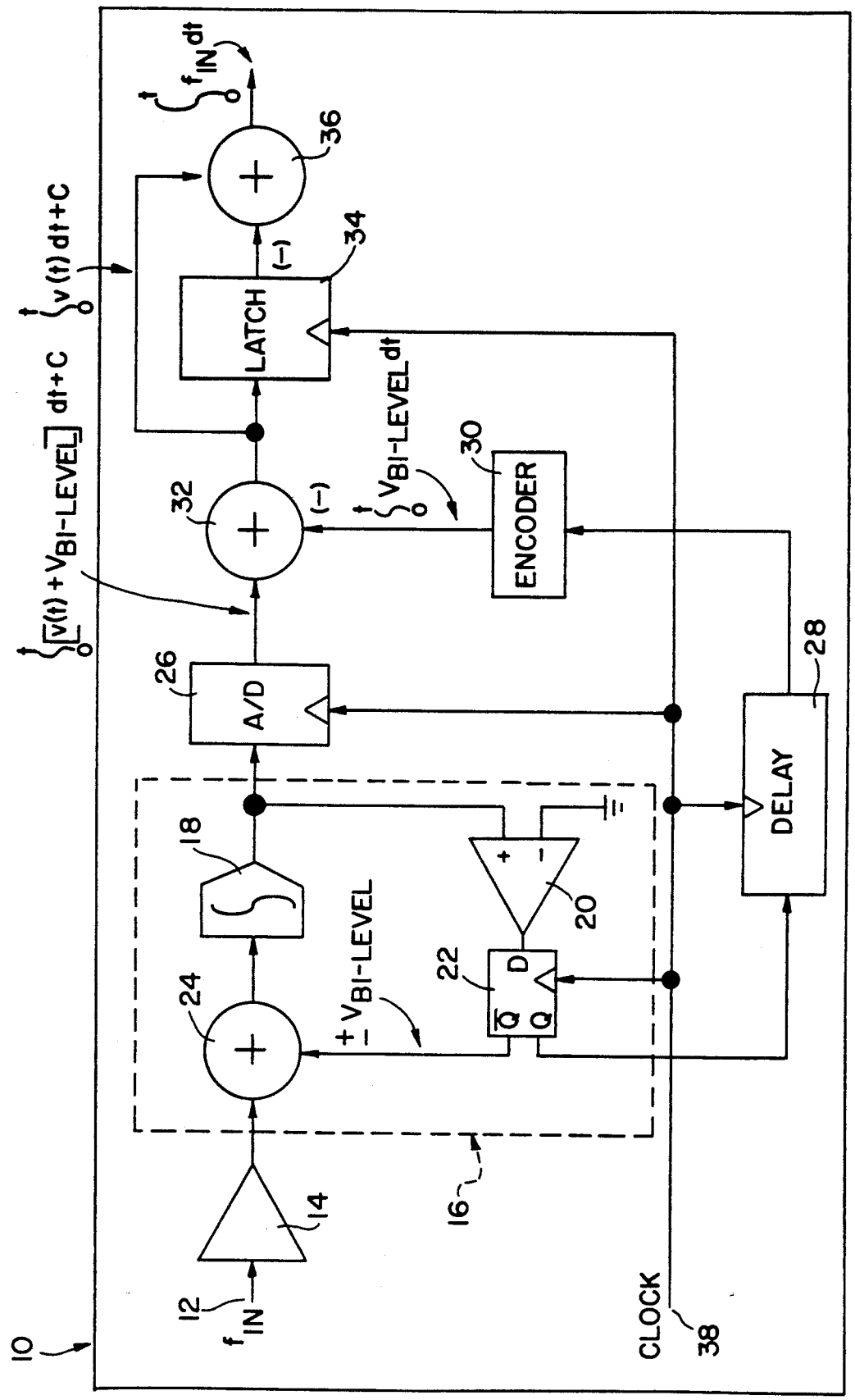
FIG. 2 is a schematic block diagram illustrating a preferred embodiment of the present invention.

FIG. 2 illustrates a block diagram of the present invention. The integrate and dump circuit 10 includes an input terminal 12 for receiving an analog signal containing bit streams of information. Connected to the input terminal 12 is an amplifier 14 for providing amplification or isolation of the input signal. Connected to the output of the amplifier 14 is an integration cycle 16. The integration cycle 16 includes an integrator 18 having its output connected to the positive terminal of a comparator 20. The negative terminal of the comparator 20 is connected to ground. The output of the comparator 20 is connected to the data input of a data flip-flop 22. Data flip-flop 22 has its clock input connected to a clock 38 for timing purposes. A summer 24 is connected to the output of the amplifier 14 and the negative output of the data flip-flop 22 for receiving and summing signals therefrom. The output of the summer 24 is connected to the input of the integrator 18 for providing the summation of the amplified analog input signal and the bi-level input provided from the data flip-flop 22.

The output of the integrator 18 is connected to an analog-to-digital converter 26 for quantizing the integrated output to thereby provide a digital response. The analog-to-digital converter 26 further receives a clock input from clock 38 for timing purposes.

Connected to the output of the analog-to-digital converter 26 is a first digital subtractor 32 (summer with one negated input) for subtracting a bi-level input provided from the delayed positive output of data flip-flop 22 from the quantized integrated output. Connected between the positive output terminal of data flip-flop 22 and digital subtractor 32 are a delay 28 and an encoder 30. The delay 28 receives a clock input from clock 38 and provides a time delay sufficient to compensate for the time required for the analog-to-digital conversion. The encoder 30 provides a proper coded output of the kind provided by analog-to-digital converter 26.

The output of the digital subtractor 32 (summer with one negated input) is connected to a latch 34 having a clock input connected to clock 38. A second subtractor 36 (summer with one negated input) is provided having input terminals connected to the output of the latch 34 and the output of the first digital subtractor 32. The second subtractor 36 subtracts the previous value held by the latch 34 from the current output, thereby providing an integrated output response.

In operation, an analog input signal containing information is amplified by amplifier 14. The amplified input signal is summed together by summer 24 with a bi-level input that is obtained from an integration output for purposes of preprocessing the input signal. This summation is then integrated by the integrator 18. The bi-level input is obtained from the integrator output on the prior clock cycle being applied to a comparator which compares the signal with ground (0 volts) and produces an output that is stored in the data flip flop 22. The bi-level preprocessing input is stored for one entire clock cycle in the data flip-flop 22, the negative output of data flip flop 22 providing the bi-level input value.

The output of the integrator 18 is then quantized by the analog-to-digital converter 26. The quantized integrated output undergoes postprocessing whereby the integral of the bi-level input is subtracted from the digitized integrated output. This bi-level postprocessing input is the positive output of the data flip flop 22. The resulting quantized integrated value is then stored in a latch 34. The difference is then taken between the latch output which essentially is the previous output value and the current output value to provide for the integrated response. The resulting sign bit may be utilized to provide a hard decision which determines the cumulative polarity of the input signal over each bit interval.

If desired, the entire difference may be used to provide a soft decision which provides not only the cumulative polarity but also the magnitude.

Figure 3:
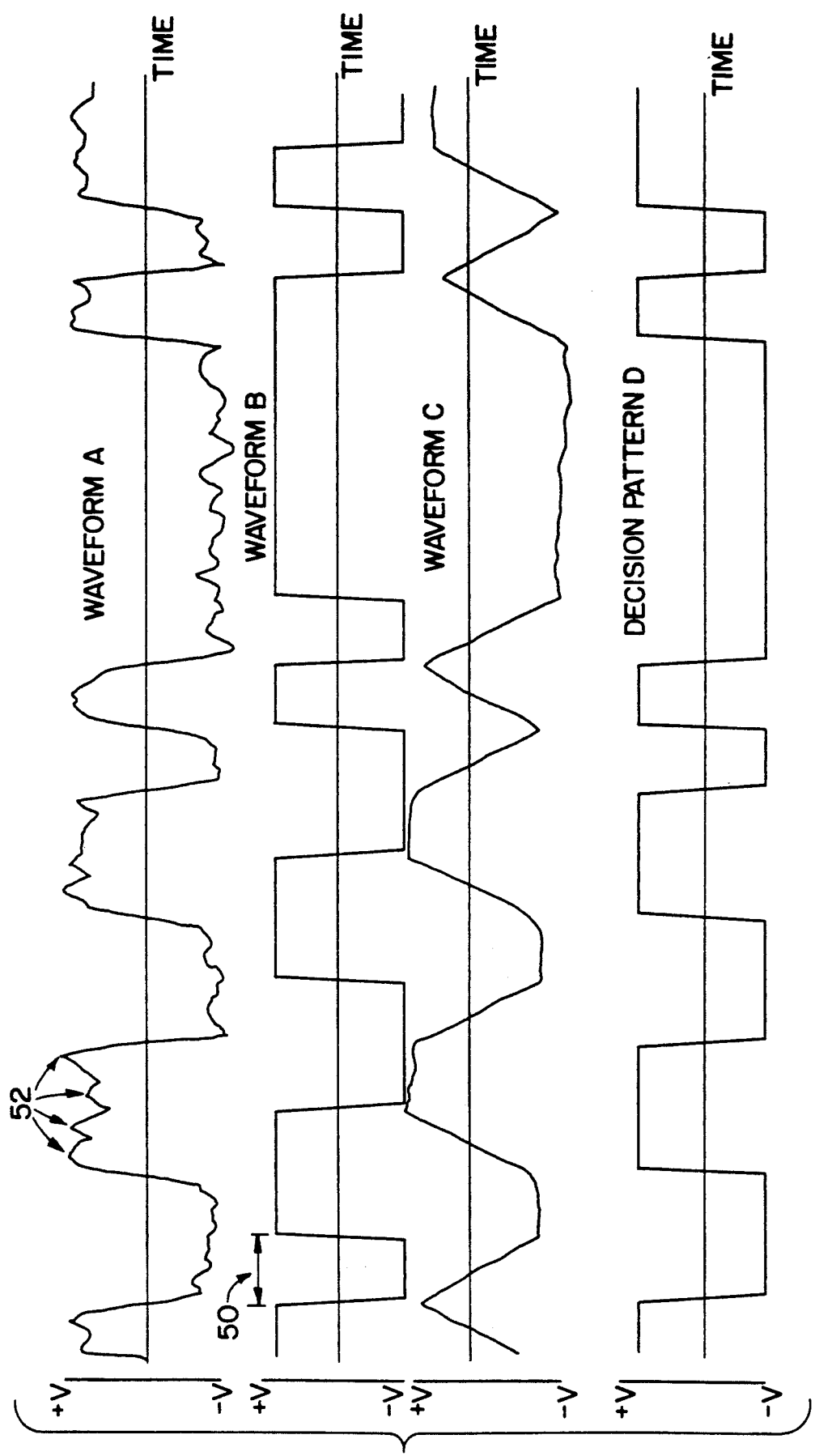
FIG. 3 is a timing diagram which illustrates the integration response in accordance with the present invention.

FIG. 3 illustrates the timed integration response of an integrate and dump circuit in accordance with the present invention. Waveform A is a given analog input signal containing bit streams of information and a nominal amount of error 52. Waveform B is the resulting bi-level preprocessing input. It is the negative output of the data flip-flop 22 as shown on FIG. 2 and has a value of either negative or positive (V) volts. Waveform C is the resulting integrated output of integrator 18. Waveform D illustrates the hard decision pattern recovered from the analog input signal. The decision pattern shown provides the cumulative polarity over each bit interval. In essence, waveform A and waveform B are summed together and integrated, the result of which produces waveform C. Waveform D is the recovered data which is obtained after waveform C has been quantized and postprocessed.

Modifications could be made herein to improve circuit performance. For instance, a second latch could be coupled to the output of the second subtractor 36 shown on FIG. 2 and used to hold the output data level.

In view of the foregoing, it can be appreciated that the present invention enables the user to achieve a high efficiency digital integrate and dump circuit with a digital output without the requirements of a separate dump cycle. Thus, while this invention has been described herein in connection with a particular example thereof, no limitation is intended thereby except as defined by the following claims. This is because the skilled practitioner will recognize that other modifications can be made without departing from the spirit of this invention after studying the specification and drawings.

I claim:

1. An integrate and dump circuit for recovering data from an analog signal, comprising:

input means for receiving an analog signal containing a series of data information;

integrator means connected to the input means for receiving the summation of an analog input signal and a bi-level preprocessing input that is provided from the integrator means output to thereby preprocess the input signal, said integrator means producing an integrated output response therefrom;

an analog-to-digital converter means connected to the output of the integrator means for quantizing the integrated signal and producing a digital output;

postprocessing means including subtraction means connected to the output of the analog-to-digital converter means for subtracting a bi-level postprocessing input therefrom to thereby postprocess the output; and means connected to the output of the subtraction means for providing the difference between the current output signal and the previous output signal, said difference being the recovered data.

2. The circuit as defined in claim 1 whereby the bi-level input provided for preprocessing the input signal is provided from the integrator means and further comprises:

a comparator means connected to the output of the integrator means for comparing the integrator output with ground and producing an output therefrom;

a data flip-flop connected to said comparator output for storing said comparator output therein and having a negative output providing the bi-level preprocessing input.

3. The circuit as defined in claim 2 whereby a positive output of the data flip flop provides the bi-level postprocessing input.

4. The circuit as defined in claim 3 whereby said postprocessing means further comprises:
   a time delay for compensating for the analog-to-digital conversion; and
   an encoder for receiving the bi-level postprocessing input from said data flip-flop and converting said signal to code, said code being subtracted from the output of the analog-to-digital converter means.

5. The circuit as defined in claim 4, further comprising:
   latch means for storing the previous output of the postprocessed digital integrated output, said previous output being subtracted from the current output to provide the recovered data.

6. The circuit as defined in claim 5, further comprising:
   timing means including a clock connected to the data flip-flop, time delay, encoder and latch means for providing necessary timing.

7. An integrate and dump circuit with digital output for recovering digital information from an analog signal to thereby reduce error contributions and enhance the ability to detect the presence of information, comprising:
   input means for receiving an analog signal containing a series of data information;
   integrator means connected to the input means for receiving an analog input signal therefrom and producing an integrated output response;
   preprocessing means for preprocessing said analog input signal, wherein said preprocessing includes adding a bi-level preprocessing input to the analog input signal, said bi-level preprocessing input provided from said integrator means output being applied to a comparator means, said comparator means comparing the integrator output with ground and storing the bi-level output in a data flip-flop connected thereto said bi-level preprocessing input being the negative output of said data flip flop;
   an analog-to-digital converter connected to the output of the integrator means for quantizing the integrated signal and producing a digital output;
   postprocessing means including subtractor means connected to the output of the analog-to-digital converter for subtracting a bi-level postprocessing input therefrom, said bi-level postprocessing input being the positive output of said data flip flop;
   means for subtracting the previous output signal from the current output signal to thereby obtain the recovered digital information, said previous output signal being stored by a latch means connected to the output; and
   timing means including a clock connected to said data flip-flop, time delay, encoder and latch means for providing necessary timing.

8. The circuit as defined in claim 7 whereby said postprocessing means further comprises a delay and encoder means connected between the positive output of said data flip flop and subtractor means.

9. A method for providing an integration for recovering information from an analog signal, said method comprising:
   receiving an analog signal containing series of data information;
   integrating an analog input signal with an integrator to thereby produce an integrated output signal therefrom;
   preprocessing said input signal by adding a bi-level preprocessing input that is provided from the output of the integration;
   quantizing the integrated output signal with an analog-to digital converter to obtain a digital output; and
   subtracting an integral of a bi-level postprocessing input from the quantized integrated output signal to thereby provide postprocessing of the signal; and
   subtracting the previous output signal from the current output signal to thereby obtain the recovered information.

10. The method as defined in claim 9 whereby the step of obtaining the bi-level preprocessing input further comprises:
    comparing the integration output signal with ground; and
    storing the output of the comparison in a data flip-flop, whereby the negative output of the data flip-flop provides the bi-level preprocessing input while the positive output provides the bi-level postprocessing input.

11. The method as defined in claim 10 whereby the step of postprocessing the quantized integrated output further comprises:
    delaying the bi-level input to compensate for the time required to perform the quantization; and
    encoding the bi-level input signal to a coded output which represents the integral of the bi-level input.

12. The method as defined in claim 11 further comprising the step of storing the previous output with a latch for comparison with the current output.

* * * * *